United States Patent [19]

Hightower et al.

[11] Patent Number: 5,276,277

[45] Date of Patent: Jan. 4, 1994

[54] APPARATUS FOR CONTROLLING INDOOR ELECTROMAGNETIC SIGNAL PROPAGATION

[75] Inventors: Neale C. Hightower, Stone Mountain; Douglas R. O'Neil, Atlanta, both of Ga.

[73] Assignee: BellSouth Corporation, Atlanta, Ga.

[21] Appl. No.: 991,437

[22] Filed: Dec. 16, 1992

Related U.S. Application Data

[62] Division of Ser. No. 713,858, Jun. 12, 1991.

[51] Int. Cl.$^5$ ............................................. H05K 9/00
[52] U.S. Cl. ............................. 174/35 MS; 174/35 R
[58] Field of Search ..................... 174/35; 361/424; 219/10.55; 333/236, 243

[56] References Cited

U.S. PATENT DOCUMENTS

| | | |
|---|---|---|
| 1,815,922 | 7/1931 | Lapof . |
| 2,183,790 | 12/1939 | Dillehay et al. ................... 250/108 |
| 2,793,245 | 5/1957 | Dunn ................................. 174/35 |
| 2,860,176 | 11/1958 | Lindgren ........................... 174/35 |
| 3,070,646 | 12/1962 | Lindgren ........................... 174/35 |
| 3,134,020 | 5/1964 | Shoenfeld . |
| 3,322,879 | 5/1967 | Lindgren ........................... 174/35 |
| 3,517,627 | 6/1970 | Kruse ................................ 109/82 |
| 3,713,960 | 1/1973 | Cochran, II . |
| 4,514,586 | 4/1985 | Waggoner ........................ 174/35 |
| 4,740,654 | 4/1988 | Lindgren ........................... 174/35 |
| 4,770,916 | 9/1988 | Leukel et al. ..................... 428/95 |
| 4,786,758 | 11/1988 | Zielinski ........................... 174/35 |
| 4,806,703 | 2/1989 | Sims ................................. 174/35 |
| 4,865,834 | 9/1989 | Tanihara et al. ................. 423/634 |
| 4,867,795 | 9/1989 | Ostertag et al. ................. 106/459 |
| 4,869,970 | 9/1989 | Gulla et al. ...................... 428/621 |
| 4,981,137 | 1/1991 | Kondo et al. ................. 128/653 A |

*Primary Examiner*—Leo P. Picard
*Assistant Examiner*—Bot L. Ledynh
*Attorney, Agent, or Firm*—Jones & Askew

[57] ABSTRACT

A system for the establishment and control of an electromagnetic signal propagation environment containing a particular set of desirable radio frequency characteristics within a bounded area. The bounded area is typically either a business office environment or a residential environment. The electromagnetic signal propagation control system provides interference rejection by preventing electromagnetic interference signals from entering an enclosure to interfere with an enclosed communications system or by preventing signals generated by the enclosed communications system from exiting the enclosure and interfering with another nearby communications system. The system also customizes the electromagnetic signal environment to improve communications within interior areas otherwise blocked from signal propagation and to absorb signal reflections from interior surfaces that may cause interference for the enclosed communications system. In addition, the system selectively rejects or accepts electromagnetic signals passing into and exiting from the enclosure to permit desired radio frequency communications between a communications system inside the enclosure and a second system outside the enclosure. The system is installed by utilizing aesthetically appealing building materials comprising conductive, absorptive, reflective, or frequency selective electromagnetic characteristics.

25 Claims, 3 Drawing Sheets

APPARATUS FOR CONTROLLING INDOOR ELECTROMAGNETIC SIGNAL PROPAGATION

This is a division of application Ser. No. 07/713,858, filed Jun. 12, 1991 by Neale C. Hightower and Douglas R. O'Neil, entitled "SYSTEM FOR CONTROLLING INDOOR ELECTROMAGNETIC SIGNAL PROPAGATION".

TECHNICAL FIELD

The present invention relates in general to selectively controlling the propagation of electromagnetic signals, and relates in particular to an indoor electromagnetic signal propagation control system for establishing and optimally controlling the propagation of electromagnetic signals and establishing an environment containing a particular set of desirable radio frequency characteristics within a bounded area.

BACKGROUND OF THE INVENTION

The operations of wireless communications systems in the United States have traditionally been regulated by the Federal Communications Commission (FCC) to reduce the likelihood of electromagnetic interference between wireless communications systems operating within the same frequency range and close geographic locations. Historically, the FCC has addressed the electromagnetic interference issue by licensing wireless communications system operators and assigning such licensed operators the usage of specific radio frequencies to be utilized in a particular geographic location. Because the operations of these wireless communications systems were limited to a relatively small number of operators, "clear channel" frequencies could be assigned by the FCC to wireless communications operators on a limited geographic basis. Typically, the same frequency assigned to a wireless communications system operator was not reused by another wireless communications system operator within a 65 to 150 mile radius, depending on the system parameters such as antenna height, transmitter power, and service type. In an electromagnetic environment where there are few licensed operators, geographic separation between operators is large, and wireless communications system transmitter movement is infrequent, the FCC coordination method for interference control is quite adequate.

Advances in wireless communications system technology have permitted the introduction of wireless communications systems for the mass market place, and allowed the extensive use of cellular radio telephones and radio paging systems for operation in both business office and home environments. The rapid growth of wireless communications operations in these environments is radically impacting the historical coordination method for reducing electromagnetic interference between wireless communications systems. For example, cellular radio telephones and radio paging systems have become increasingly popular for mobile communications involving everyday business and home situations. Thus, the wireless communications signal environment for any one geographic location may vary over a period of time as mobile wireless communications systems are moved by operators into and away from a specific site. Also, as the number of wireless communications systems operators increases in a geographic location, signal density and environment complexity also increases, and thereby further enhances the likelihood of electromagnetic interference in a particular business or home environment. Therefore, advances in wireless communications system technology have provided an electromagnetic environment where there are a relatively large number of operators, geographic separation is small, and transmitter movement is frequent. Any regulatory attempt to use traditional licensing and record-keeping methods to reduce electromagnetic interference between these wireless communications systems will not be adequate, particularly in view of the labor-intensive activity required to achieve such wireless communications system operation coordination.

Also, the historical coordination method for reducing electromagnetic interference between wireless communications systems is not utilized by the FCC to control the operation of small, very low power wireless communication devices that are licensed under the Code of Federal Regulations, 47 C.F.R. 15. Specifically, the operations of FCC Part 15 regulated devices are not coordinated by specific frequency assignment or fixed geographic locations. These FCC Part 15 regulated devices include wireless local area networks, cordless telephones, wireless business telephone systems, and automatic door openers. Because of the advances in wireless communications technology, these devices are also commonly found in both business office and home environments. One can also expect the signal density and complexity provided by these FCC Part 15 regulated devices to continue to increase as the popularity of these devices increases in the marketplace.

Therefore, the reduction of electromagnetic interference, in a dense and complex environment provided by mass-produced, and often-times mobile, wireless communications systems, is an issue that requires an innovative solution to overcome the inherent difficulties of traditional regulation methods. This electromagnetic interference problem is particularly highlighted when many different wireless,communications systems are operated without coordination and within a close proximity to each other, such as the operation of these devices inside an office building.

Focusing upon this office building example, the wireless communications signal environment currently found in a typical business office is complex and dense, and thus is susceptible to electromagnetic interference. These electromagnetic interference signals may be provided either by radiating sources within the office itself, or by sources outside, but within close proximity to, the office. Portable and hand-held cellular radio telephones, radio paging systems, cordless telephones, wireless business telephone systems, and wireless local area networks may all be utilized for wireless communications within a business office or offices located in a particular office building. Thus, physical separation between such wireless communications systems is no longer easily attained within this business office environment. Also, the limited availability of frequencies within the electromagnetic spectrum prohibits each potential user within a business office environment from utilizing a "clear channel" frequency for interference-free wireless communications. Thus, electromagnetic interference is likely to occur between several wireless communications systems operating within the same indoor environment. Furthermore, the interference signal environment in a typical business office is subject to change; as office tenants upgrade or vary their wireless communications systems installations, or as office tenants move their wireless communications systems from offices or buildings, the electromagnetic signal environment changes. In addition to potential interference problems, the reflections of wireless communications signals from the interior surfaces of an office environment will also create signal amplitude, signal phase, and tune-delay spread problems that disrupt communications within the indoor environment. Therefore, the requirement exists for a system to flexibly control the electromagnetic environment within an indoor location, such as a business office, or a building containing many business offices.

Previous approaches for controlling electromagnetic signal propagation within an enclosure have provided complete shielding of the enclosure either to trap the broad electromagnetic signal environment within the enclosure, or to prevent the spectrum of electromagnetic signals from entering the enclosure. Typically, enclosure shielding methods have involved the use of highly-conductive metal sheets, foil, or wire mesh surrounding a structure to prevent electromagnetic interference within the enclosure. This complete shielding approach addresses the issue of electromagnetic interference, but does not permit selective frequency, amplitude, or phase control of the indoor electromagnetic environment.

In U.S. Pat. No. 2,793,245 to Dunn, a radio-wave shielded enclosure is provided to completely shield the interior of the enclosure from interference by stray radio waves. The radio-wave shielded enclosure is made of separate screening panels fabricated from radio-wave shielding materials; the panels are modified to be assembled and bolted together at a desired location.

In U.S. Pat. Nos. 4,740,654, 3,322,879, 3,070,646, and 2,860,176, all to Lindgren, double-isolated electrically shielded screen rooms are provided of various constructions. The double-screen shields are fabricated from a variety of materials known to possess shielding characteristics that prevent electromagnetic and electrostatic wave penetrations of the enclosure. The double-screen shield construction provides two complete screen shields, each wholly encompassing the included space and electrically isolated from each other, that maintain complete electrical conduction continuity between each shield.

In U.S. Pat. No. 4,806,703 to Sims, a modular system, including a number of shielding panels each having a support or frame covered with a layer of conductive material, is provided to isolate sensitive equipment from broad spectrum interference because of ambient electromagnetic radiation. A shielding layer overlies a substrate at the face of the panel and extends around the panel edges to maximize conductivity between adjacent panel edges.

The prior art also recognizes that certain materials display electromagnetic characteristics useful for controlling the electromagnetic signal environment to reduce signal interference. Certain materials are known to reduce electromagnetic interference by either cancellation or absorption of electromagnetic signals. Materials are also available to provide a reflective surface that redirects incident electromagnetic signals away from the surface.

In U.S. Pat. No. 4,514,586 to Waggoner, a shielding material is provided comprising a nonconductive base material combined with a metal layer of electrolessly-deposited copper overlain with a second layer. The shielding material typically covers the enclosure of an electronic device and is utilized to protect such equipment from electromagnetic interference or to prevent the unintended transmission of electromagnetic interference signals by these electronic devices.

In U.S. Pat. No. 4,865,834 to Tanihara et al., platelet-like magnetite and maghemite particles, useful as electromagnetic wave absorbing and shielding material, are provided for shielding devices that are the sources of electromagnetic waves.

In U.S. Pat. No. 4,867,795 to Ostertag et al., platelet-like pigments based on iron oxide are provided for electromagnetic screening of electronic devices.

In U.S. Pat. No. 4,869,970, to Gulla et al., a shielding coating is provided for attenuating electromagnetic radiation interference emitting from electronic equipment.

In addition, the prior art recognizes several methods for absorbing electromagnetic signals by the use of selected materials. Carbon fibers, carbonyl iron power, or ferrite can be interspersed within a selected material to obtain a specified absorptive characteristic in a selected frequency band. Alternatively, for broadband absorbers, multiple tapered or graded absorption layers comprising carbon filings or carbon powder are utilized to obtain absorptive characteristics over a broad frequency range.

A radio wave cancellation technique recognized in the prior art provides radio wave cancellation by positioning a highly-conductive metal sheet approximately one-quarter wavelength distance from a 377 ohms per square resistive sheet. Radio waves passing first through the front surface of this assembly, the resistive sheet, are cancelled by this technique. Alternatively, positioning the highly-conductive metal sheet between 377 ohms per square resistive sheets, each placed one-quarter wave length distance on either side of the metal sheet, produces an assembly that provides radio wave cancellation characteristics for both front and rear assembly surfaces.

The prior art also recognizes that reflective surfaces are easily constructed from highly-conductive wire mesh or highly conductive metal sheets. This construction method is commonly referred to as sheathing. Good electrical bonding between adjacent conductive sheets covering a large surface is assured by extending tabs from the edges of the sheet material such that adjacent tabs maintain contact between adjacent sheets.

Frequency selective surfaces exhibiting band-pass, band-reject, high-pass, and low-pass characteristics are also known in the prior art. For example, an evenly spaced grid of wire appears as a reflective surface so long as the spacing is small compared to a signal wavelength. By controlling the spacing of the wire grid, the frequency selective surface can provide a high-pass filter characteristic for passing electromagnetic signals above a selected cut-off frequency. By further example, the prior art also provides a technique for forming a band-pass filter by periodically performing a highly conductive sheet with frequency sensitive element geometries, including rectangular slot, circular slot, annular slot, four-legged symmetrically loaded slot, and three-legged loaded slot. Other frequency sensitive element geometries can be periodically spaced as an array on a conductive sheet to create low-pass, high-pass, band-pass, or band-reject filters. Examples of such geometrics include: dipoles, crossed dipoles, dual periodic strips, and Jerusalem crosses.

Although shielded enclosures and materials or techniques for providing selected electromagnetic characteristics are individually recognized in the prior art, the prior art does not provide a comprehensive system for optimally and flexibly controlling an indoor electromagnetic signal environment to establish and maintain a selected set of desirable electromagnetic characteristics within the enclosure. There is a need for an indoor electromagnetic signal propagation control system to provide interference rejection by preventing electromagnetic interference signals from entering an enclosure to interfere with an enclosed communications system or by preventing signals generated by the communications system within the enclosure from exiting and either interfering with another nearby exterior communications system or being intercepted by another exterior communications system. Also, there is a need to customize the indoor electromagnetic signal environment, both to provide communications with interior areas otherwise blocked from signal propagation and to absorb signal reflections from interior surfaces that may cause interference for the enclosed communications system. Furthermore, there is a need for a frequency selective shield to selectively reject or accept electromagnetic signals passing into and exiting from the enclosure to permit desired communications between a second communications system inside the enclosure and another communications system outside the enclosure or to prevent undesired interception of signals radiated from the communications system within the enclosure. Also, there is a need for an indoor electromagnetic signal propagation control system constructed with aesthetically appealing building materials manufactured to include conductive, absorptive, reflective, or frequency selective electromagnetic characteristics. In addition, there is a requirement for an indoor electromagnetic signal propagation control system that provides a flexible and easy installation method to permit modification of the indoor electromagnetic environment as required to match interference signal environment variations occurring inside or outside an enclosure over a period of time.

SUMMARY OF THE INVENTION

The foregoing needs for an indoor electromagnetic signal propagation control system are satisfied by the present invention that creates a controlled electromagnetic signal environment for an enclosure where wireless communications devices are used such that signal interference problems are minimized and a particular set of desirable electromagnetic characteristics are established and maintained within the enclosure. The invention controls the electromagnetic signal environment by shielding the enclosure so that electromagnetic signals radiating from certain sources outside the enclosure are modified to display desired propagation characteristics within the enclosure. This shielding also permits an enclosed communications system either to provide secure communications within the enclosure or to selectively communicate with other communications systems outside the enclosure. In addition, the invention provides, within the enclosure, a controlled electromagnetic environment that is customized to minimize communications signal "dead spots" and to reduce interference caused by the combination of signal reflections from the enclosure interior surfaces and the location of the interior communications systems. Thus, the interior electromagnetic signal propagation control system provides an effective communications environment for communications systems within an enclosure, minimizes electromagnetic interference either transmitted by the enclosed communications systems or received by the same systems, attenuates electromagnetic signals either transmitted by enclosed radiating devices or received from exterior radiating devices, and permits an enclosed communications system to selectively communicate with exterior communications system.

Generally described, the present invention provides a system for selective propagation of electromagnetic signals, including the signals of at least one communications system operating within at least one certain frequency range throughout a bounded region. The present invention attenuates electromagnetic signals within each certain frequency range that enter or leave the bounded region, and permits the passage across the boundary of signals in at least one other frequency range outside each certain frequency range of each enclosed communications system. In this manner, a communications system operator within the bounded region can communicate therein without interfering with or interference from another system using the same frequency range and located outside the bounded region. Also, the communications system operator within the bounded region can securely communicate inside the bounded region with an enclosed communications system operating within the certain frequency range and also can communicate outside the bounded region with a communications system operating in the other frequency range.

Considering the invention in further detail, the function of signal attenuation across the boundary of the bounded region is provided by a shield in the nature of a band-reject filter spatially substantially coextensive with the region boundary. Similarly, the passage across the boundary of signals in at least one other frequency range is provided by a filter preferably possessing either band-pass, high-pass, or low-pass characteristics, and also spatially substantially coextensive with the region boundary. The bounded region encloses a space defined by a structure typically including walls, floors, ceilings, doors, or other building elements that commonly comprise the structure of a building. Therefore, both the shield and the filter are spatially substantially coextensive with the structure of the bounded region.

Because the present invention combines a filter that rejects at least one first frequency range with a filter that passes at least one second frequency range, both filters being spatially substantially coextensive with the bounded region, electromagnetic interference is minimized or reduced to acceptable levels for each enclosed communications system operating within the first frequency range, while one-way or two-way communications are simultaneously permitted between an enclosed communications system operating within the second frequency range and an exterior second communications system operating within same second frequency range.

In addition to the aspects described above, the present invention also provides a system comprising a shield, a filter, and a signal leveling component that selectively customizes the propagation of the electromagnetic signals in at least one selected certain frequency range and within the bounded region to provide effective communications operations by at least one selected communications system operating within at least one selected certain frequency range inside the enclosure. For selected enclosed communication systems, the signal levering component selectively grooms the interior electromagnetic signal environment to maintain a reasonably uniform signal amplitude level throughout the enclosure and to minimize reflections of each communications signal radiated by each selected enclosed communications system from surfaces within the enclosure to reduce multipath signal interference within that system. This grooming of the indoor electromagnetic environment is accomplished by matching the structural characteristics of the enclosure and the geographic locations of the selected enclosed communications systems with the appropriate signal leveling component to overcome the communications deficiencies within the enclosure. The signal leveling component may include a signal reflective component, a signal absorptive component, a signal cancellation component, or any combination of the above described components. The position of the signal leveling component is dependent upon both the structural characteristics of the enclosure and the geographic locations of each selected enclosed communications systems. Thus, similar to the shield and the filter, the signal leveling component can be spatially substantially coextensive with the boundary of the region. Alternatively, the signal leveling component can be located along a structure positioned completely within the enclosure, such as a support column.

Another aspect of the present invention provides a system for selective propagation of electromagnetic signals, including the signals of at least one communications system operating within at least one certain frequency range throughout a bounded region defining a space enclosed by a structure. The system comprises a shield for attenuating to a predefined noninterference level the signals within each certain frequency range that enter or leave the region. A filter permits the passage across the boundary of signals in at least one second frequency range outside each certain frequency range of each enclosed communications system. A signal leveling component selectively customizes the propagation of the electromagnetic signals within the bounded region to provide effective communications operations by at least one selected enclosed communications system operating within at least one selected certain frequency range. In this manner, users within the bounded region can use each communications system therein without interfering with or interference from another communications system using the same frequency range and located outside the bounded region. Also, the user can communicate outside the bounded region with other exterior communications systems operating in the other frequency range and can securely communicate inside the bounded region with enclosed communications systems operating in one of the certain frequency ranges. Furthermore, for each selected enclosed communications system operating within a selected certain frequency range, multipath interference is reduced to ensure proper communications within the enclosure.

The shield, filter, and signal leveling components are all spatially substantially coextensive with the structure enclosing the space defined by the bounded region. Similar to the other disclosed aspects of the present invention, the shield is preferably a band-reject filter and the filter is preferably either a band-pass filter, a high-pass filter, a low-pass filter, or any combination of the above-described filters that passes signals within at least one predefined frequency range across the structure of the bounded region, while simultaneously attenuating signals within at least one second predefined frequency range. In this manner, the indoor electromagnetic signal propagation control system prevents interference signals of a predefined amplitude threshold from entering or leaving the bounded region and permits an enclosed communications system to securely communicate with another enclosed communications system operating within one of the first predefined frequency ranges. The system also permits an enclosed communications system to communicate with an exterior communications system operating within one of the second, non-interfering frequency ranges. For example, the filter preferably allows FM broadcast, AM broadcast, and television broadcast signals or other desired communications signals to be received within the bounded region while rejecting signals from any interfering communications system operating in each certain frequency band of each indoor communications system.

To permit easy installation of the components for the indoor electromagnetic signal propagation system within a bounded region by the use of well-known construction techniques, the shield, filter and signal leveling components all comprise standard building materials modified to display selected electromagnetic characteristics. These modified building materials include such items as wallboard or wall panels, partition panels, floor coverings, wall coverings, windows, carpets, ceiling tiles, flooring panels, and doors.

The shield comprises building materials modified to display frequency selective electromagnetic characteristics that attenuate electromagnetic signals within at least one certain frequency range of at least one indoor communications system, generated by either an enclosed communications system or a system outside the enclosure, which pass through the structure constructed of these building materials.

The filter also comprises building materials modified to display frequency selective electromagnetic characteristics; however, these building materials allow the signals of at least one desired, second frequency range to pass through the structure constructed with these building materials for transmission or reception by an indoor communications system operating within the second frequency range.

In addition, the signal leveling component comprises building materials modified to display absorptive electromagnetic characteristics, reflective electromagnetic characteristics, or a combination of both absorptive and reflective electromagnetic characteristics. The absorptive building materials provide absorption of electromagnetic signals within each selected certain frequency range of each indoor communications system operating within one of the selected certain frequency ranges. In contrast to the absorptive materials, the reflective building materials reflect electromagnetic signals for each selected certain frequency range. The selected use of these absorptive and reflective building materials permit a designer to customize the interior of the enclosure such that optimal communications operations are achieved within the indoor electromagnetic environment. For example, the absorptive materials absorb signal reflections which may cause multipath interference effects during indoor communications operations because of radiated signals within each certain selected certain frequency range. Both reflective and absorptive materials may be combined to provide communications coverage for an interior location that is not directly in line with either the selected enclosed receiving or transmitting communications subsystem.

A typical indoor electromagnetic signal propagation environment for an office building includes the operation of one or more wireless communications systems, such as wireless business telephone systems, wireless paging systems, cellular radio telephones, wireless local area networks, wireless computer links, cordless telephone systems, or automatic door openers. However, this typical indoor electromagnetic signal propagation environment is likely to change over the course of time, in view of the wireless communications system technology advances, office building tenant changes, and changes in the various installed wireless communications systems. Thus, the use of standard building materials modified to possess selected electromagnetic characteristics provides a flexible and aesthetic means for controlling the electromagnetic signal propagation environment within an enclosure.

The present invention provides a system for securing indoor communications and for reducing interference, while simultaneously customizing the indoor electromagnetic signal propagation environment to increase communications system effectiveness, and thereby overcomes the limitations of the traditional system that controls interference through coordination by licensing and geographic or frequency selection. Also, the flexible control of the indoor electromagnetic signal propagation environment provided by the present invention enables the wireless communications system operator to obtain current effective wireless communications and also satisfy future user demands for wireless communications services.

The present invention also provides a method for selective control of propagation of electromagnetic signals, including the signals of the communications system operating within at least one certain frequency range throughout a bounded region. The method comprises attenuating the signals within each certain frequency range that enter or leave the bounded region to reduce interference with the indoor communications system operating within one of the certain frequency ranges and also to reduce interference to an exterior communications system operating within the same frequency range or to prevent interception of signals radiating from the indoor communications system operating within such a frequency range. The method also permits the passage across the boundary of signals in at least one second frequency range outside each of the certain frequency ranges of each communications system operating within one of the certain frequency ranges. Hence, an indoor communications system user could use a communications system operating within at least one of the several frequency ranges to communicate with other communications systems located outside the bounded region and operating in the same second frequency range.

Another aspect of the method permits leveling the signals within at least one selected certain frequency range to selectively customize the propagation of electromagnetic signals within the bounded region to provide effective communications operations by the indoor communications system operating within the selected frequency range.

Reviewing the method in further detail, the bounded region includes a space enclosed by a structure, such as a business office within an office building or a home within a residential neighborhood. The signals within each certain frequency range that enter or leave the bounded region are attenuated to a predefined noninterference level to permit interference-free, interference limited, or secure communications operation of the indoor communications systems operating within each certain frequency range.

Although the preferred embodiment is directed toward the control of an indoor radio frequency signal environment, the present invention should be understood as encompassing the control of electromagnetic signals in the frequency spectrum other than the radio frequency spectrum.

Therefore, it is an object of the present invention to provide an apparatus and method for selective controlling propagation of electromagnetic signals within and between a bounded region.

It is another object of the present invention to provide an indoor electromagnetic signal environment inside an enclosure by shielding the interior of the enclosure from signals within at least one certain frequency range radiated by sources outside the environment.

It is a further object of the present invention to provide an indoor electromagnetic signal propagation control system that permits an enclosed communications system to selectively communicate with other communication systems outside the enclosure.

It is a further object of the present invention to provide an indoor electromagnetic signal propagation control system that selectively customizes the electromagnetic environment within the enclosure to minimize communication signal dead spots and reduce multipath interference caused by the combination of signal reflections provided by the enclosure interior surfaces and the location of the enclosed communications systems operating within at least one selected frequency range.

It is a further object of the present invention to provide an indoor electromagnetic signal propagation control system that provides an effective communication environment for communication systems within an enclosure and also minimizes electromagnetic interference either transmitted by the enclosed communications systems or received by these same systems.

It is a further object of the present invention to provide an indoor electromagnetic signal propagation control system that provides secure communications for an enclosed communications system.

It is a further object of the present invention to provide an indoor electromagnetic signal propagation control system that is constructed using aesthetically appealing building materials appropriate for use in a business or home environment.

It is a further object of the present invention to provide an indoor electromagnetic signal propagation control system that is easily installed using standard building construction techniques to permit the modification of the control system as required to accommodate variations in the exterior or interior electromagnetic environment.

DETAILED DESCRIPTION OF THE PREFERRED EMBODIMENT

Figure 1:
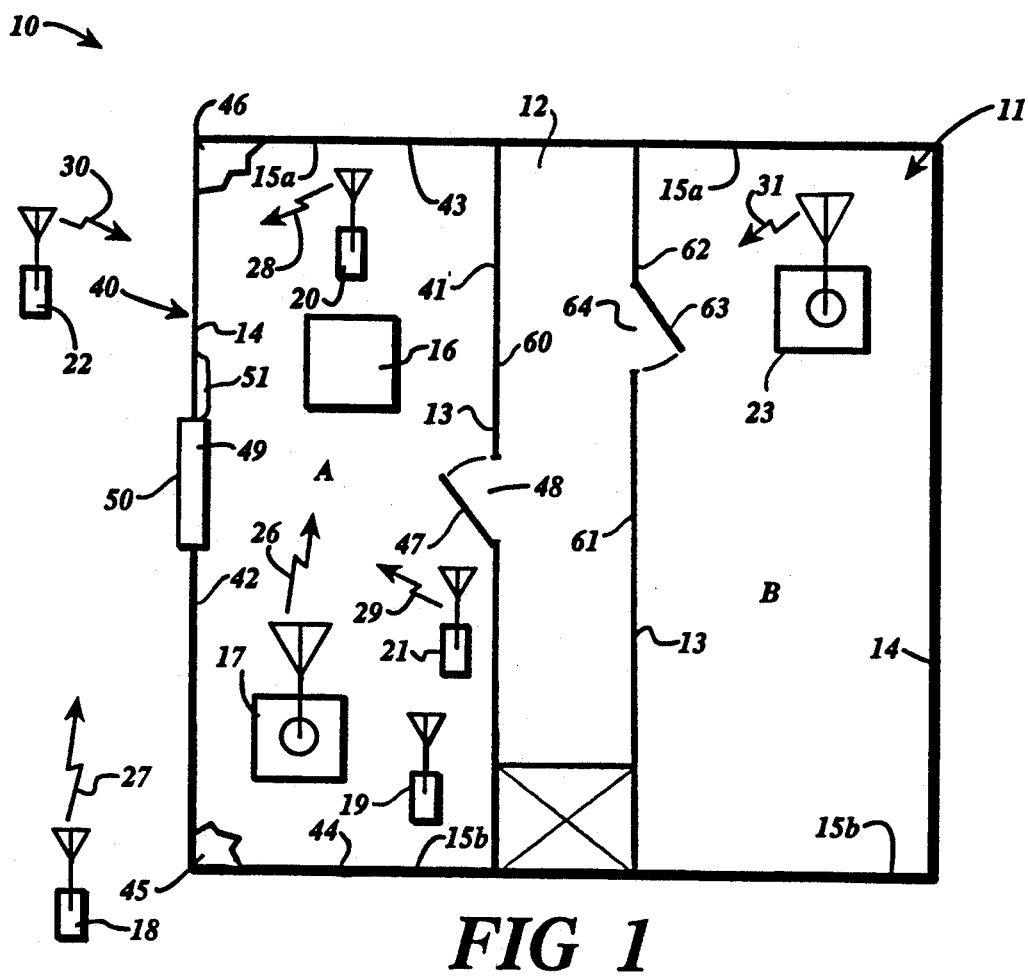
FIG. 1 is a plan view of a typical office building floor embodying the present invention

First referring to FIG. 1, a plan view is provided of a typical office floor layout for a multi-story office building illustrating an application of the present invention. Generally speaking, the indoor electromagnetic signal propagation control system 10 is installed within an indoor environment containing wireless electromagnetic transmitting systems, receiving systems, or transmitting and receiving systems, such as an office building floor 11, to control the electromagnetic signals characteristics within the indoor environment. The office building floor 11 contains an office enclosure A and an office enclosure B. The office enclosure A is separated from the office enclosure B by a central hall 12. The indoor environment provided by the office building floor 11 is typical of the layout for offices located on one floor of a multi-story office building; specifically, two large offices separated by a center hallway with elevator access.

The office enclosure A and the office enclosure B each contain a front wall 13 separated from a rear wall 14 by two side walls 15a and 15b. As illustrated in FIG. 1, each front wall 13 bounds the central hall 12 and includes a door opening 48 or 64, respectively, for either the office enclosure A or the office enclosure B. The office enclosure A also includes a support column 16 that provides structural support for the building. The support column 16 is connected to the floor of the office enclosure A and extends to the ceiling of that office enclosure. The support column 16 is constructed using typical building construction techniques, including the use of reinforcing rods to add support for a poured concrete column. The support column 16 containing reinforcing rods tends to reflect or attenuate selected wireless communications systems signals within the office A. Those persons skilled in the art will recognize that the support column 16 is representative of a physical obstruction, typically found in an office environment, that blocks the transmission of electromagnetic signals inside the office.

The office enclosure A also contains a cordless telephone system 17, a radio paging receiver system 19, a cellular telephone system 20, and a wireless local area network (LAN) 21. The cordless telephone system 17 provides wireless telephone system communications operating, for example, in the radio band 902 Megahertz-928 Megahertz (MHz), and transmits a cordless telephone signal 26. The radio paging receiver system 19 provides a receiver for a radio paging system for persons inside the office enclosure A; a transmitter 18 of the radio paging system is located outside the office building floor 11 and transmits a radio paging signal 27. The radio paging receiver system 19 and the radio paging transmitter system 18 form a wireless communications system that typically operates, for example, at one of the following frequencies: 150 MHz and 450 MHz. In the future, satellite-based paging systems may also operate at frequencies in the 1500 MHz range. The cellular telephone system 20 allows persons working inside the office enclosure A to communicate with a party using a cellular telephone 22 system located outside the office floor 11. The cellular telephone system 20 transmits a cellular telephone signal 28 and the cellular telephone system 22 transmits a cellular telephone signal 30. The wireless LAN 21 provides wireless data communications links for computers used in the office enclosure A; the wireless LAN 21 operates, for example, in the 2400 MHz-2483.5 MHz band and transmits a wireless LAN signal 29. Similarly, the office enclosure B also contains a cordless telephone system 23 that operates at 902 MHz-928 MHz and transmits a cordless telephone signal 31. Those persons skilled in the art will recognize that these wireless communications systems are representative of wireless receiving and transmitting radio systems, and associated operational frequency bands, commonly found in an office or residential environment. Although the cordless telephone system 17, the radio paging transmitter system 18, the radio paging receiver system 19, the cellular telephone system 20, the wireless LAN 21, the cellular telephone system 22, and the cordless telephone system 23 are radio frequency devices, the present invention is not limited to the radio frequency range of the electromagnetic spectrum. In addition, each of the above systems may comprise more than one wireless communications unit.

Those persons skilled in the art will recognize that the present invention may also be applied in other indoor environments including a multi-building business park, a cluster housing complex, or a suburban residential environment. Similar to the indoor electromagnetic environment provided by the office building floor 11, each of these alternative indoor environments is subject to dense and complex electromagnetic signal propagation environments because of the proliferation of radiating communications systems in common use for both business and residential applications.

The indoor electromagnetic signal propagation control system 10 provides an office control system 40 to optimally control the electromagnetic environment within the enclosure defined by the office building floor 11. The office control system 40 is spatially substantially coextensive with the office enclosure A, the office enclosure B, and the central hall 12. In this manner, the electromagnetic environment for each office enclosure is individually designed to reduce electromagnetic interference, to secure communications, and to customize electromagnetic signal transmissions and reception within the respective bounded office space.

For the embodiment of the present invention illustrated in FIG. 1, the office control system 40 includes a front wall panel filter 41, a rear wall panel filter 42, side wall panel filters 43 and 44, a floor absorber 45, a ceiling reflector 46, a door panel filter 47, a window filter 50, and a wall panel reflector 51. Each of these elements of the office control system 40 comprises standard building materials that are modified to display selected electromagnetic characteristics, as is explained below in greater detail. For example, the front wall panel filter 41 is constructed of a standard wall panel material that is modified to display filtering electromagnetic characteristics and is an integral component of the front wall of the office enclosure A. In this manner, the office control system 40 is installed within the office enclosure A by using standard building components, modified to provide selected electromagnetic characteristics, either to initially construct the office or to remodel the office as required for the expected indoor electromagnetic environment. The use of these modified building components, for the installation of the office control system, provides an office environment that is electromagnetically controlled and aesthetically appealing. Also, the installation of the office control system 40 within the office enclosure A requires little modification of standard office construction techniques because the system elements themselves are standard building components.

The front wall panel filter 41, the rear wall panel filter 42, and the side wall panel filters 43 and 44 are building material elements that, once installed, provide the walls of the structure defined by the office enclosure A. More specifically, the front wall panel filter 41, the rear wag panel filter 42, and the side wall panel filters 43 and 44 are spatially substantially coextensive with, respectively, the front wall 13, the rear wall 14, and the side walls 15a and 15b for office enclosure A. The front wall panel filter 41 is separated by the rear wall panel filter 42 by the side wall panel filters 43 and 44. The front wall panel filter 41 is connected to one set of ends of the spaced-part side wall filters 43 and 44; the rear wall panel filter 42 is connected to opposite ends of the side wall filters 43 and 44. Each wall panel filter comprises standard building components modified to display selected filtering electromagnetic characteristics.

For the embodiment illustrated in FIG. 1, the front wall panel filter 41, the rear wall panel filter 42, and the side wall panel filters 43 and 44 comprise wall panel or sheet rock building materials preferably displaying band-reject electromagnetic characteristics. Specifically, the front wall panel filter 41, the rear wall panel filter 42, and the side wall panel filters 43 and 44 form a band-reject filter that prevents the electromagnetic signals within the frequency ranges of the cordless telephone system 17 and the wireless LAN 21, the cordless telephone signal 26 and the wireless LAN signal 29, from exiting the office enclosure A. Also, the band-reject filter provided by the panels prevents interfering electromagnetic signals within the frequency ranges of the cordless telephone system 17 and the wireless LAN 21 from entering the office enclosure A. Therefore, the panels permit the secure operation of the cordless telephone system 17 and the wireless LAN 21 within the office enclosure A because transmission signals provided by the cordless telephone system 17 and the wireless LAN 21 do not exit the office enclosure A. Also, electromagnetic interference provided by other cordless telephone systems or wireless LANs operating in close proximity and within the operating frequency ranges of the cordless telephone system 17 or the wireless LAN 21 is reduced because the band-reject filter prevents these interference signals from entering the office enclosure A. However, the band-reject filter provided by the wall panel filters permits electromagnetic signals outside the operating frequency ranges of the cordless telephone system 17 or the wireless LAN to enter and exit the office enclosure A. For example AM, FM, television broadcast signals, cellular telephone signals, and radio paging system signals may be received within the office enclosure A. The broadcast signals are not rejected by the band-reject filters; AM broadcast stations typically operate from 535 kHz to 1605 kHz; FM broadcast stations typically operate from 88 MHz to 108 MHz; and television broadcast stations typically operate at 54-88 MHz, 174-216 MHz, and 470-890 MHz. As illustrated by FIG. 1, the radio paging signal 27, the cellular telephone signal 28, and the cellular telephone signal 30 pass the boundary provided by the band-reject filter because these signals are outside the selected notch frequency range of the band-reject filter.

Those persons skilled in the art will recognize that the band-reject filter formed by the wall panel filters is not necessarily designed to absolutely attenuate the amplitude of the cordless telephone signal 26, the wireless LAN signal 29 or the interference signals. Instead, the band-reject filter may be designed to attenuate the signals within the selected frequency range to an acceptable signal level for proper wireless communications system operations within the enclosure. In this manner, signals within the frequency ranges of the band-reject filter enter or exit the office enclosure A; however, these signals are, at a minimum, reduced to a tolerable interference signal level for proper wireless communications system operations within the office enclosure A.

Although the front wall panel filter 41, the rear wall panel filter 42, and the side wall panel filters 43 and 44 completely enclose the space defined by the office enclosure A, rectangular form cut outs are also provided in these wall panel filter elements for locating a door and a window. Specifically, a door opening 48 to the office enclosure A is cut out of the front wall 13 and the front wall panel filter 41. Also, an opening 49 is cut out of the rear wall 14 and the rear wall panel filter 42 for the installation of a window within the office enclosure A.

To maintain completely secure transmissions by the cordless telephone system 17 and the wireless LAN 21 within the office enclosure A, the door panel filter 47 and the window filter 50 are respectively installed within the door opening 48 and the window opening 49; each filter preferably provides a band-reject filter to prevent the cordless telephone signal 26 and the wireless LAN signal 29 from leaving the office enclosure A through the respective door and window openings. Also, the door panel filter 47 and the window filter 50, each acting as a band-reject filter, prevent interference signals within the operating frequency ranges of the cordless telephone system 17 and the wireless LAN 21 from entering the office enclosure A through the respective door or window. Simultaneously, the door panel filter 47 and the window filter 50 permit electromagnetic signals outside the operating frequency ranges of the cordless telephone system 17 and the wireless LAN 21 to enter the office enclosure A. Of course, FIG. 1 illustrates an application of the present invention for only one office building floor plan; multiple door panel filters and window filters could also be utilized to fill multiple-cut outs for entrances and windows within any combination of the front wall 13, the rear wall 14, the side walls 15a and 15b, the front wall panel filter 41, the rear wall panel filter 42, and the side wall panel filters 43 and 44.

The door panel filter 47 comprises a standard building material, such as a standard wood door, that is modified to display the selected electromagnetic filtering characteristic, a band-reject filter that notches the frequency ranges of the cordless telephone system 17 and the wireless LAN 21. Similarly, the window filter 50 comprises a standard building material, such as a standard glass pane window, that is modified to display the same band-reject filter characteristics.

Those persons skilled in the art will recognize that the frequency selective system provided by the combination of the front wall panel filter 41, the rear wag panel filter 42, the side wall panel filters 43 and 44, the door panel filter 47, and the window filter 50, tonning a band-reject filter to prevent electromagnetic signals within the operating frequency ranges of the cordless telephone system 17 and the wireless LAN 21 from entering or exiting the office enclosure A, may also be provided by the appropriate selection of building components modified to display band-pass, high-pass, or low-pass filtering characteristics.

Similarly, those persons skilled in the art will recognize that the use of building components adapted to display appropriate absorptive characteristics within the selected frequency range will also prevent the cordless telephone signal 26 and the wireless LAN signal 29 from entering or exiting the office enclosure A. Standard building components modified to provide absorptive electromagnetic characteristics will be described in more detail below.

In addition, those persons skilled in the art will recognize that FIG. 1 illustrates only one application for the present invention; the frequency ranges for the band-reject filter formed by the front panel filter 41, the rear panel filter 42, the side wall panel filters 43 and 44, the door panel filter 47, and the window filter 50 could also be selected to reject other frequency ranges as dictated by the operating frequency range or ranges of the specific wireless communications system or systems contained within the office enclosure A. Alternatively, a combination of low-pass, high-pass, band-pass, or band-reject filters could be utilized to provide any desired frequency selective response for an enclosure comprising any combination of standard building components, including wall panels, wall coverings, doors, partition panels, floor panels, ceiling panels and windows, by the use of the present invention.

The frequency selective system provided by the combination of the front wall panel filter 41, the rear wall panel filter 42, the side wall panel filters 43 and 44, the door panel 47, and the window filter 50, forms a band-reject filter that prevents electromagnetic signals within the operating frequency ranges of the cordless telephone system 17 and the operating frequency range of the wireless LAN 21 from entering or exiting the office enclosure A, while simultaneously permitting signals within other frequency ranges outside the cordless telephone system frequency band and the wireless LAN 21 frequency band to enter or exit the office enclosure A. Hence, exterior wireless communications systems, such as the radio paging transmitter 18 and the cellular telephone system 22, operating within these other frequency ranges, may communicate with the corresponding radio paging receiver 19 and the cellular telephone system 20 that also operate within such other frequency ranges and are located within the office enclosure A. The radio paging receiver 19 and the cellular telephone system 20 operate properly within enclosure A because their frequency bands of operation are outside the band-reject frequency bands of the band-reject filter formed by the building components of enclosure A. However, those persons skilled in the art will recognize that the radio paging transmitter 18 and the cellular telephone system 22 may also be other types of wireless communications systems that operate outside the band-reject frequency ranges of the band-reject filter, such as AM broadcast band, FM broadcast band, or television broadcast band systems.

The office control system 40 also includes the floor absorber 45 and the ceiling reflector 46 to prevent the entrance into the office enclosure A by interference signals provided by exterior electromagnetic transmitter sources, respectively located below and above the office building floor 11. The floor absorber 45 comprises standard building materials modified to display absorptive electromagnetic characteristics. These modified building components are utilized to construct the floor of the office enclosure A. Thus, floor absorber 45 contacts the bottom edges of the front wall panel filter 41, the rear wall panel filter 42, and the side wall panel filters 43 and 44. Also, the bottom of the door panel filter 47 is located directly above the floor absorber 45 when the door of office enclosure A is closed or opened inwardly.

The floor absorber 45 prevents stray interference signals from entering or exiting the office enclosure A through the floor by absorbing electromagnetic signals within at least one selected frequency range; these signals are generated either by signal sources within or below the office building floor I 1. For the embodiment illustrated in FIG. 1, the active absorbent frequency range for the floor absorber 45 is preferably compatible with the operating frequency ranges for the cordless telephone system 17 and the wireless LAN 21, and for any other communications system whose radiated signals are to be contained within the enclosure A, while permitting transmissions within the the frequency ranges of the radio paging transmitter system 18 and the frequency ranges of the cellular telephone system 20 and the cellular telephone system 22 to enter and exit the office building floor 11. Those persons skilled in the art will recognize that the operating frequency range for the floor absorber 45 could also be a frequency range or ranges different from the described embodiment; the active absorbent frequency range for the floor absorber 45 is dependent upon the electromagnetic characteristics of the absorber building material selected by the designer for the control of the electromagnetic environment within the office enclosure.

The office control system 40 also includes the ceiling reflector 46 to prevent stray interference emissions from entering the office enclosure A through the floor above the office. The ceiling reflector 46 comprises standard building materials modified to display reflective electromagnetic characteristics. Once installed, ceiling reflector 46 functions as both a ceiling and an electromagnetic signal reflector for office enclosure A. The ceiling reflector 46 connects the top portions of front wall panel filter 41, rear wall panel filter 42, and side wall panel filters 43 and 44. The frequency response for the ceiling reflector 46 is selected such that the reflector provides reflective electromagnetic characteristics for the desired frequency ranges to prevent undesired interfering signals from entering the office enclosure A through the floor of the above office. For the embodiment illustrated in FIG. 1, the reflective frequency range of the ceiling reflector 46 is preferably compatible with the frequency ranges for the cordless telephone system 17 and the wireless LAN 21 to reflect from the enclosure those radiated signals originating from outside the enclosure. However, the ceiling reflector 46 permits signals within the appropriate frequency ranges of the radio paging transmitter system 18, the cellular telephone system 20, and the cellular telephone system 22 to enter and exit the office enclosure A. In this manner, the radio paging receiver system 19 can receive the radio paging transmitter signal 27 from the radio paging transmitter system 18, and the cellular telephone system 20 can receive the cellular telephone signal 30 from the cellular telephone system 22.

Of course, those persons skilled in the art will recognize that both the floor absorber 45 and the ceiling reflector 46 provide similar functions; they both prevent signals within a selected frequency range from entering the office enclosure A to reduce electromagnetic interference within the office enclosure A. Furthermore, the floor absorber 45 also prevents signals within a selected frequency range from exiting the office enclosure. The floor of the office enclosure A could be assembled using materials displaying reflective electromagnetic characteristics instead of absorptive electromagnetic characteristics. Similarly, the ceiling of the office enclosure A could be assembled by using materials displaying absorptive electromagnetic characteristics instead of reflective electromagnetic characteristics. Thus, the floor absorber 45 could be replaced by a floor reflector, the ceiling reflector 46 could be replaced by a ceiling absorber.

As shown in FIG. 1, the rear wall panel filter 42 includes a wall panel reflector 51. The wall panel reflector 51 is positioned along the rear wall 14 and near the support column 16 to reflect electromagnetic signals around the region blocked by the reinforcing rods contained in the support column 16. Specifically, the wall panel reflector 51 preferably reflects cordless telephone signal 26 and wireless LAN signal 29 to provide communications coverage within the office enclosure A for the shadowed area behind the support column 16. The operating frequency range for the panel reflector 51 is selected by the designer such that the reflector 51 reflects electromagnetic signals, transmitted by one or more enclosed wireless communications systems, which would otherwise be blocked by an obstacle within the enclosure. In this manner, the electromagnetic environment within the office enclosure A illustrated in FIG. 1 is "groomed" or customized to provide optimum communications operations for the cordless telephone system 17 and the wireless LAN 21. Regardless of specific location, the wall panel reflector 51 comprises standard building materials modified to provide a reflective electromagnetic characteristic. The wall panel reflector 51 may be installed within office enclosure A such that an observer cannot distinguish the visible exteriors of the wall panel reflector 51 from the rear wall panel filter 42.

Those persons skilled in the art will recognize that a combination of reflective materials, absorptive materials, or signal cancellation techniques may be required to provide optimum communications operations for the cordless telephone system 17 and the wireless LAN 21 within the office enclosure A. Thus, the wall panel reflector 51 provides one example for customizing the electromagnetic environment within the office enclosure A; alternative electromagnetic environment customizing designs may require the use of reflective electromagnetic materials, absorptive electromagnetic materials, signal cancellation techniques, or a combination of electromagnetic materials or techniques.

As illustrated in FIG. 1, the office control system 40 also includes a hall side-wall absorber 60 and a hall side-wall absorber 61. The hall side-wall absorber 60 is located adjacent to the office enclosure A; the hall side-wan absorber 61 is located adjacent to the office enclosure B. Both the hall side-watt absorber 60 and the hall side-wall absorber 61 are installed within the office building floor 11 to prevent electromagnetic energy within a specific frequency range provided by either adjacent office space from leaking into the central hall, and ultimately into an office, as undesired interference.

Electromagnetic signal leakage occurs when the door to either office A or B opens during transmission operations by the cordless telephone system 17, the cellular telephone system 20, or the wireless LAN 21 in the office enclosure A, or by the cordless telephone system 23 in the office enclosure B. For example, if the door to the office enclosure A opens during transmission operations by a selected wireless communications system inside that office, the hall side-wall absorber 60 and the hall side-wall absorber 61 absorbs any leaked transmissions, including the cordless telephone signal 26, the cellular telephone signal 28, and the wireless LAN signal 29, to prevent reflection of these unintended interference signals into the office enclosure B if that office's door is also open. The hall side-wall absorber 60 and the hall side-wall absorber 61 comprise standard building materials modified to display absorptive electromagnetic characteristics. The use of these modified building materials permits office hall way construction using well-known building techniques. In this manner, the hall side-wall absorbers 60 and 61 function as both signal absorbers and hall walls.

As illustrated in FIG. 1, the office control system 40 also controls the electromagnetic signal environment within the office enclosure B. The office control system 40 includes the front wall panel filter 62 and the door panel filter 63. The front wall panel filter 62 separates the office enclosure B from the central hall 12 and preferably provides a low-pass filter to prevent the cordless telephone signal 31 from exiting the office enclosure B. More specifically, for the present embodiment illustrated in FIG. 1, the front wall panel filter 62 passes all electromagnetic signals below the frequency of 900 MHz but prevents signals above that cut-off frequency, including the cordless telephone signal 44 within the frequency range of 902 MHz–928 MHz, from entering or exiting the office enclosure B. The front wall panel filter 62 reduces interference between the cordless telephone system 17 and the cordless telephone system 23 by preventing the cordless telephone signal 31 from reaching the office enclosure A.

Similar to the office A wall panel filters, the front wag panel filter 62 comprises standard building materials modified to display filtering electromagnetic characteristics. This implementation of the front wall panel filter 62 permits the use of well-known building techniques for installation of the filter and provides an appealing appearance compatible with typical office environments. In this manner, the front wall panel filter 62 provides both a low-pass filter and a front wall for the office enclosure B.

The door panel filter 63, located within an entrance 64 and on the front wall panel filter 62, also preferably provides a low-pass filter similar to the electromagnetic characteristics provided by the front wall panel filter 62. More specifically, the low-pass filter provided by the door panel filter 63 comprises a standard building material for an office door that is specifically adapted to provide selected low-pass filter characteristics. When the office door for the office enclosure B is completely closed, the door panel filter 63 prevents the cordless telephone signal 31 from exiting the office enclosure B and interfering with the operations of the cordless telephone system 17. In this manner, the door panel filter 63 functions as both a door and a low-pass filter.

Those persons skilled in the art will recognize that the embodiment illustrated in FIG. 1 is only one of many combinations of the frequency selective, reflective, and absorptive building components that can be provided by the indoor electromagnetic signal propagation control system 10. Many different combinations of frequency selective, absorptive, and reflective building components are possible for the installation of the present invention to properly control the electromagnetic environment within an enclosure. Nevertheless, the embodiment of FIG. 1 illustrates that an electromagnetic interference problem would likely occur between the cordless telephone system 17 and the cordless telephone system 23 unless the indoor electromagnetic signal propagation control system 10 was installed on the office building floor 11 to control the electromagnetic environments contained in the office enclosure A, the office enclosure B and the central hall 12. That embodiment also illustrates that secure communications operations for the cordless telephone system 17 and the wireless LAN 21 within the office enclosure A likely would not be possible without the installation of the indoor electromagnetic signal propagation control system on the office building floor 11. Because many different electromagnetic signal environment combinations are possible, the indoor electromagnetic signal propagation control system 10 provides a flexible means for controlling the electromagnetic environment within an enclosure. In addition, the present invention provides an aesthetically appealing system for controlling the electromagnetic environment within an enclosure by the use of specially adapted standard building materials that display selected electromagnetic characteristics.

Figure 2:
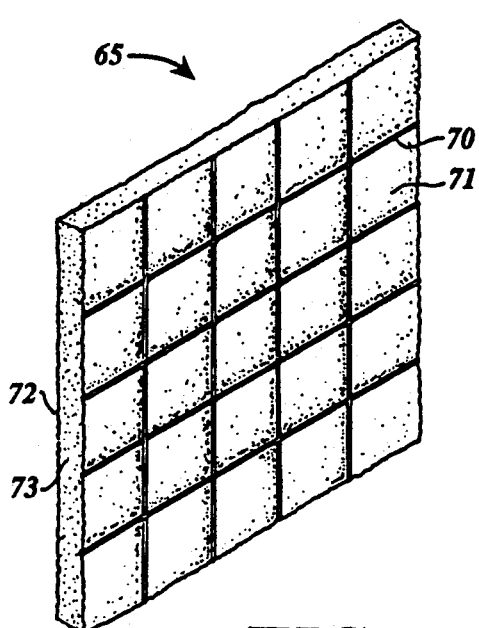
FIG. 2 is a rear surface isometric view of a wall board panel displaying frequency selective filtering electromagnetic characteristics, according to an embodiment of the present invention.

FIG. 2 provides an embodiment of a building component according to the present invention. A wan board panel filter 65 provides a frequency selective surface that can display either low-pass, high-pass, band-reject, or band-pass filtering characteristics. An evenly spaced grid of metal wires, grid 70, is bonded to a rear surface 71 of the wall board panel filter 65. The grid 70 provides an electromagnetic reflective surface for an electromagnetic signal so long as the grid spacing is small compared to a wavelength of the electromagnetic signal. A desired filtering characteristic can be obtained by controlling the spacing of the grid wires of the grid 70. A panel material 73 separates the rear surface 71 from a front surface 72 positioned on the front surface of the wag board panel filter 65. The panel material 73 comprises standard wall board panel material typically utilized for both business office and residential construction. The grid 70 is bonded to the rear surface 71 such that the grid 70 is not visible to an observer inside the enclosure upon installation of the wail board panel filter 65. The wall panel filter 65 constructed in this manner provides a simple building component for permitting a selected frequency range of incident electromagnetic signals to pass through either the rear surface 71 or the front surface 72.

The wall panel filter 65 provides the building component required to install the front wall panel filter 41, the rear wall panel filter 42, the side wall panel filters 43 and 44, and the front wall panel filter 62 as shown in FIG. 1. However, those persons skilled in the art will recognize that this technique for providing a frequency selective surface for a standard building component may also be utilized for other standard building components, such as a ceiling tile, flooring tile, partition panel, wall covering, floor covering, window, or door.

Those persons skilled in the art will also recognize that a frequency selective surface can be provided by replacing the grid 70 with different frequency sensitive element geometries that can be periodically spaced on a thin sheet to create low-pass, high-pass, band-pass, or band-reject filters. These element geometries include dipoles, crossed dipoles, dual periodic strips, Jerusalem Crosses and other frequency sensitive element geometries.

Those persons skilled in the art will also recognize that a specific frequency selective surface displaying band-pass electromagnetic properties is created by periodically spacing on a conductive sheet any of the following frequency sensitive element geometries: the rectangular slot, the circular slot, the annular slot, the four legged symmetrically loaded slot, and the three legged loaded slot. One skilled in the art will further recognize that the electromagnetic duals of these surfaces and geometries are used to create band-reject filters.

Figure 3:
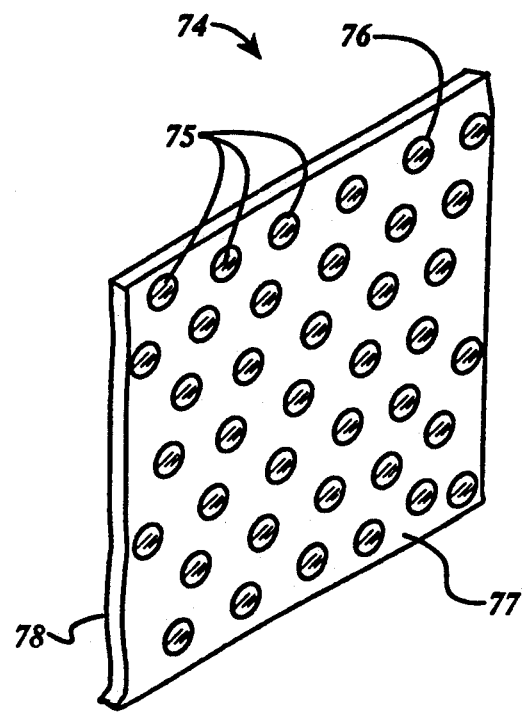
FIG. 3 is a rear surface isometric view of a layer of wall covering displaying frequency selective filtering electromagnetic characteristics, according to an embodiment of the present invention.

FIG. 3 provides an embodiment of a building component of the present invention. A wall covering filter 74 provides a frequency selective surface that can display either low-pass, high-pass, band-reject, or band-pass filtering characteristics. A periodically spaced array 75 of frequency sensitive elements 76, is printed on a rear surface 77 of the wall covering filter 74. A wall covering front surface 78 positioned along the front of the wall covering filter 74 can be aesthetically compatible with the interior of the enclosure. The array 75 provides a desired filtering characteristic by controlling the spacing between the elements 76 and the geometry of the elements 76. The array 75 is printed on the rear surface 77 such that the array 75 is not visible to an observer inside the enclosure upon installation of the wag covering filter 74. Those persons skilled in the art will recognize that this technique for providing a frequency selective surface for a standard building component may also be utilized for other standard building components, such as a ceiling tile, flooring tile, floor covering, partition panel, wall panel, window or door.

Figure 4:
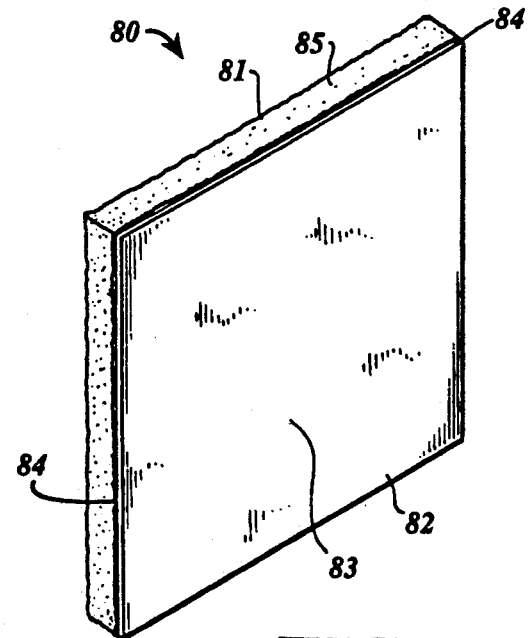
FIG. 4 is an isometric view of a flooring panel displaying reflective electromagnetic characteristics, according to an embodiment of the present invention.

FIG. 4 provides an embodiment of another building component for the present invention. A panel reflector 80, easily constructed from highly-conductive wire mesh or highly-conductive metal sheets, is a building component specifically modified to reflect incident electromagnetic signals within a certain frequency range. A conductive sheet 83 is bonded to a rear surface 82 of the panel reflector 80. Panel material 85 separates the rear surface 82 from a front surface 81. The panel material 85 comprises standard building material utilized for the construction of typical office buildings in residences, including wall board, ceiling or flooring tiles, partition panels, and doors. The conductive sheet 83 slightly overlaps the side edges of the panel material 85 to form tabs 84. Electrical continuity is provided between adjacent panel reflectors by positioning each reflector such that their respective tabs 84 abut.

In this manner, a standard building material is modified to provide reflective electromagnetic characteristics. More specifically, bonding the conductive sheet 83 to the rear surface 82 of the panel reflector 80 provides a reflective surface for incident electromagnetic signals. Because the conductive sheet 83 is bonded to the rear surface 82, an observer within the enclosure views only the front surface 81 of the panel reflector 80. The front surface 81 has an appearance similar to that provided by standard building, components. Thus, installing the panel reflector 80 within an office building or residence provides an aesthetically appealing reflective surface for controlling electromagnetic environment within the enclosure.

The panel reflector 80 provides the building component required to install the ceiling reflector 46 and the wan panel reflector 51 as shown in FIG. 1. Those persons skilled in the art will recognize that this technique for providing a reflective surface by modifying a standard building component may also be utilized for other building components, including a flooring tile, partition panel, wall covering, floor covering, window or door.

Figure 5:
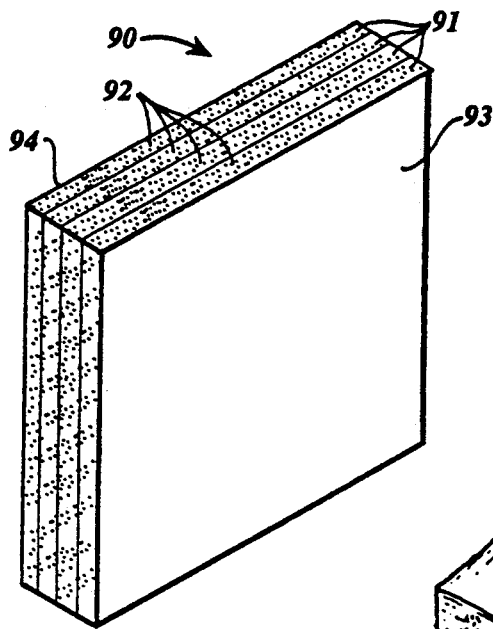
FIG. 5 is a top surface isometric view of a ceiling panel displaying absorptive electromagnetic characteristics, according to an embodiment of the present invention.

FIG. 5 also provides an embodiment of a building component modified to display a selected electromagnetic characteristic for use with the present invention. A panel absorber 90 provides a surface for absorbing incident electromagnetic signals of a selected frequency range. The panel absorber 90 includes absorptive layers 91 positioned between a top surface 93 and a bottom surface 94. The absorptive layers 91 comprise a standard building component material that is interspersed with an absorptive material 92, preferably carbon fibers, carbonyl iron powder, or ferrite material, to obtain a specified absorptive characteristic for a desired frequency range. More specifically, the panel absorber 90 can be constructed using almost any standard building component specifically adapted to provide the desired absorptive characteristic. These building materials include wall board, ceiling or flooring tile, partition panel, and a door.

A high level of absorption is achieved by constructing the panel absorptive 90 with multiple absorptive layers 91. More specifically, the absorptive layer 91 located on the top surface 93 provides low level absorptive characteristics for a selected frequency range. Each successive absorptive layer 91 provides an increasing level of absorption for signals within the selected frequency range. The largest level of signal absorption is provided by the absorptive layer 91 attached to the bottom surface 94. This method of combining multiple absorptive layers 91 with increasing absorptive characteristics for each successive layer 91 also provides absorptive characteristics over a broad frequency range.

The panel absorber 90 provides the building component required to install the floor absorber 45, the hall side-wall absorber 60, and the hall side-wall absorber 61 as shown in FIG. 1. Those persons skilled in the art will recognize that this technique for providing an absorbent surface for a standard building component may also be utilized for other building components including a ceiling tile, partition panel, wail covering, floor covering or door.

Those person skilled in the art will also recognize that frequency selective, reflective or absorptive surfaces can also be provided using the above-described techniques for another standard building component, a glass pane window, typically utilized during the construction of an office building or a residence. More specifically, a desired electromagnetic characteristic can be provided for a window by bonding a thin film that displays the desired electromagnetic characteristics to the surface of a window.

Figure 6:
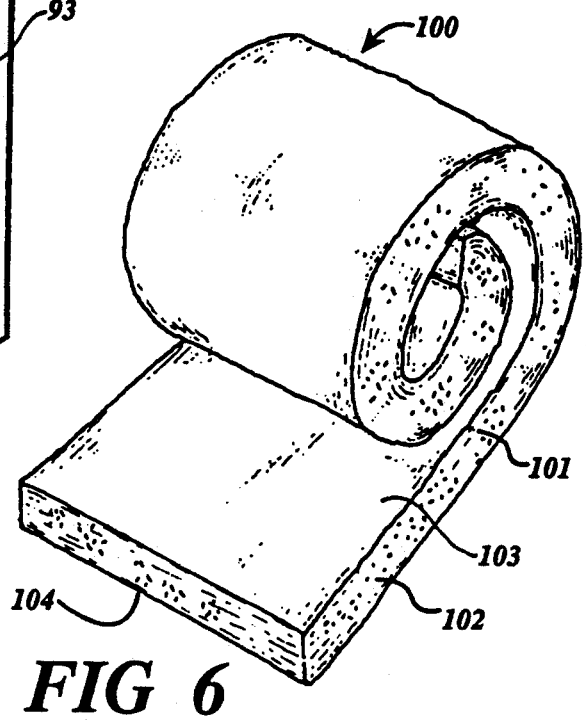
FIG. 6 is an isometric view of a roll of insulation material displaying absorptive electromagnetic characteristics, according to an embodiment of the present invention.
Figure 7:
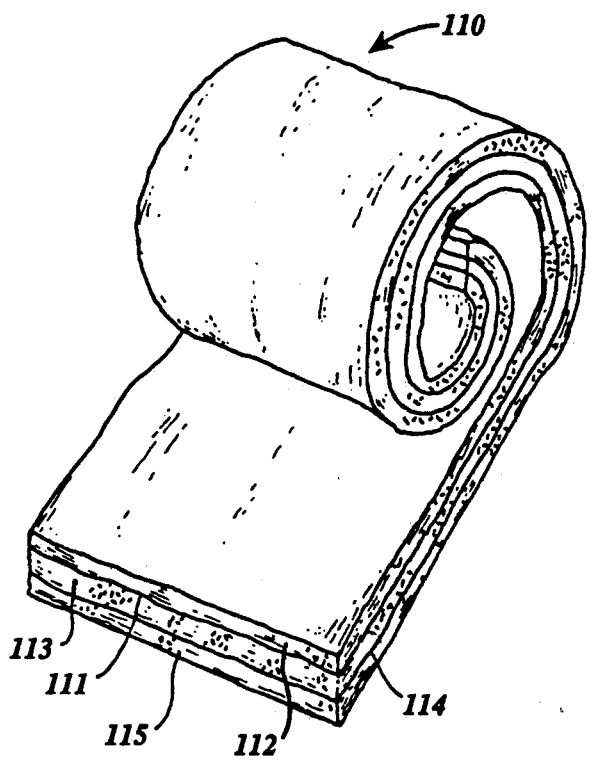
FIG. 7 is an isometric view of a roll of layered insulation material displaying frequency selective electromagnetic characteristics, according to an embodiment of the present invention.

FIGS. 6 and 7 provide further embodiments of building components modified to provided desired electromagnetic characteristics for use with the present invention.

FIG. 6 shows an insulation panel 100, including an insulation layer 101 provided between a front surface 103 and a rear surface 104. The insulation layer 101 comprises insulation material commonly utilized during the construction of office buildings and residences for insulating the interior of the building from exterior temperature extremes. The insulation layer 101 typically comprises fiberglass insulation material or foam insulation material. An absorption material 102 is interspersed within the insulation layer 101 to provide a building component that displays an absorptive electromagnetic characteristic for a desired frequency range. The absorption material 101 preferably comprises carbon fibers, carbonyl iron powder, or ferrite material. The front surface 103 and the rear surface 104 respectively comprise typical front and rear surfaces of standard insulating material. Thus, the insulation panel 100 provides a heating and cooling insulation material that displays an absorptive electromagnetic characteristic for a desired frequency range. The insulation panel 100 can be installed in the same manner as standard insulation panel material. More specifically, the insulation panel may be installed behind walls or floors and above ceiling panels.

Alternatively, the insulation panel 100 can also provide a frequency selective building insulation material by replacing the absorptive material 102 with metallic and glossy circuit elements, dipoles, Jerusalem Crosses or other frequency sensitive elements, that can be tuned to a specific frequency range and either interspersed within the insulation layer 101 or positioned between the front surface 103 or rear surface 104 and the insulation material 101. In this manner, the installation of the frequency selective version of the insulation panel 100 within the walls, floor, or ceiling panels of an enclosure provides a filter to reduce electromagnetic interference within a selected frequency range.

FIG. 7 illustrates another embodiment of frequency selective form of building insulation material, a frequency selective insulation panel 110. The frequency selective insulation panel 110 includes a frequency selective surface 111 positioned between insulation layers 112 and 113. The frequency selective surface 111 provides a frequency selective electromagnetic characteristic within a selected frequency range for the frequency selective insulation panel 110. The frequency selective surface Ill comprises a metal grid, a conductive sheet perforated periodically with apertures or periodically spaced apart conductive elements and preferably provides either low-pass, high-pass, band-reject, or band-pass filtering characteristics.

The frequency selective insulation panel 110 provides a broader frequency range coverage by positioning additional frequency selective panels, such as a frequency selective surface 114, between the insulation layer 113 and an insulation layer 115. In this manner, several frequency selective surfaces are provided between layers of fiberglass insulation to create a frequency selective characteristic for more than one frequency range. Similar to the insulation panel absorber 100, the insulation layers 112, 113, and 115 comprise standard building insulation material, such as fiberglass insulation material or foam insulation. The frequency selective insulation panel 110 provides both heating and cooling insulation for a building as well as displaying desired frequency selective electromagnetic characteristics.

The insulation panel 100 and the insulation panel 110 provide alternative building components to the panel absorber 90 and the wag board panel filter 65 for installing, respectively, either an absorptive or a frequency selective electromagnetic component within an enclosure.

Figure 8:
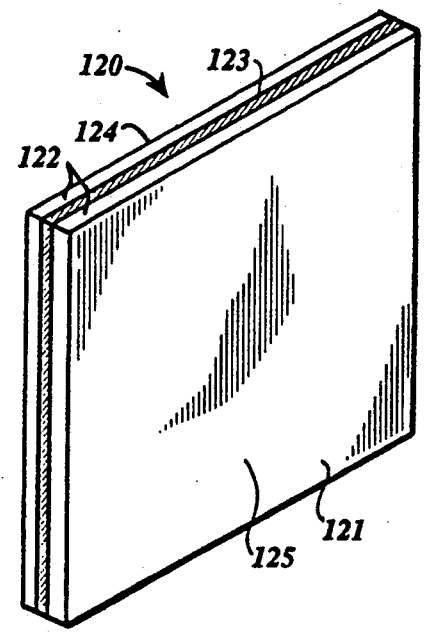
FIG. 8 is a rear surface isometric view of a flooring panel displaying electromagnetic signal cancellation characteristics, according to an embodiment of the present invention.

FIG. 8 illustrates another embodiment of a standard building component adapted to display a specific electromagnetic characteristic for use with the present invention. A signal cancellation panel 120 includes a highly conductive metal sheet 121 separated one-quarter of a wavelength distance from a 377 ohms per square resistive sheet, a resistive sheet 123. The metal sheet 121 is bonded to a rear surface 125 located on the rear surface of the signal cancellation panel 120. The resistive sheet 123 is positioned between panel materials 122. The panel materials 122 separate the rear surface 125 of the panel from a front surface 124 positioned on the front surface of the signal cancellation panel 120. Electromagnetic signals within a certain frequency range passing first through the resistive sheet 123 and then striking the metal sheet 121 are cancelled by the signal cancellation panel 120. The panel materials 122 comprise standard building material typically utilized for the construction of office buildings and residences, including wall board, ceiling or flooring tiles, partition panels or doors. In this manner, standard building components adapted to display the desired signal cancellation characteristics can also be utilized to install the present invention within an enclosure in an aesthetically appealing manner.

Those persons skilled in the art will recognize that electromagnetic signal cancellation technique provided by the signal cancellation panel 120 is an alternative for the absorptive techniques provided in FIGS. 4 and 5 for completely absorbing an electromagnetic signal within a selected frequency range. However, for a selected frequency range, absorptive electromagnetic material displays a material thickness proportional to the selected frequency range. For certain frequency ranges, the appropriate thickness of the absorbent building material would be extremely thick and thus, inappropriate for use as a standard building component for the installation of the present invention within an office building or a residence. Thus, in these instances, the electromagnetic signal cancellation technique utilized by the signal cancellation panel 120 provides a practical alternative to the use of standard building components displaying absorptive electromagnetic characteristics, including the panel absorber 90 and the insulation panel 100.

Those persons skilled in the art will also recognize that positioning a highly conductive metal sheet between parallel resistive sheets provides a multi-layer electromagnetic cancellation characteristic for cancelling signals within more than one frequency range; this technique provides a broad-band signal cancellation material.

The disclosed embodiment of the present invention has been disclosed by way of example and it will be understood that other modifications may occur to those skilled in the art without departing from the scope and the spirit of the appended claims.

We claim:

1. Apparatus for selective control of propagation of electromagnetic signals including the signals of at least one wireless communications system operating within a certain frequency range throughout a bounded region, the apparatus comprising:

shielding means for attenuating said electromagnetic signals within said certain frequency range that enter or leave said bounded region; and filtering means permitting the relatively unattenuated passage across the boundary of signals in at least one second frequency range outside said certain frequency range, so that users of each wireless communications system within said bounded region can communicate therein without interfering with or interference from another wireless communications system using the same frequency range and located outside said bounded region, and also can communicate through said boundary and outside said bounded region with an exterior wireless communications system operating in said one of said second frequency range.

2. Apparatus as in claim 1, wherein:
said shielding means comprises a band-reject filter spatially substantially coextensive with said boundary of said region.

3. Apparatus as in claim 1, wherein:
said filtering means comprises a filter spatially substantially coextensive with the boundary of the region.

4. Apparatus as in claim 1, wherein:
said bounded region comprises a space defined by structural means; and
said shielding means comprises a band-reject filter spatially substantially coextensive with said structural means.

5. Apparatus as in claim 1, wherein:
said bounded region comprises a space defined by structural means; and
said filtering means comprises a filter spatially substantially coextensive with said structural means.

6. Apparatus for selective control of propagation of electromagnetic signals including the signals of at least one communications system operating within a certain frequency range throughout a bounded region, the apparatus comprising:

shielding means for attenuating said signals within said certain frequency range that enter or leave said bounded region;

filtering means permitting the relatively unattenuated passage across the boundary of signals in at least one second frequency range outside said certain frequency range; and signal leveling means within said bounded region for selectively customizing the propagation of selected electromagnetic signals within said certain frequency range such that said propagation of said selected signals is relatively uniform throughout said bounded region, so as provide effective communications operations by said communications system operating within said certain frequency range, so that users of each communications system within said bounded region can communicate therein without interfering with or interference from another communications system using the same frequency range and located outside said bounded region, and also can communicate through said boundary and outside said bounded region with an exterior communications system operating in said second frequency range.

7. Apparatus as in claim 6, wherein:
said shielding means comprises a band-reject filter spatially substantially coextensive with said boundary of said region.

8. Apparatus as in claim 6, wherein:
said filtering means comprises a filter spatially substantially coextensive with said boundary of said region.

9. Apparatus as in claim 6, wherein:
said signal leveling means is spatially substantially coextensive with said boundary of said region and is selected from the group consisting of a signal reflective means, and a signal absorptive means, and a signal cancellation means.

10. Apparatus as in claim 6, wherein:
said bounded region comprises a space defined by a structural means; and
said shielding means comprises a band-reject filter spatially substantially coextensive with said structural means.

11. Apparatus as in claim 6, wherein:
said bounded region comprises a space defined by a structural means; and
said filtering means comprises a filter spatially substantially coextensive with said structural means.

12. Apparatus as in claim 6, wherein:
said bounded region comprises a space defined by a structural means; and
said signal leveling means is spatially substantially coextensive with said structural means and is selected from the group consisting of a signal reflective means, a signal absorptive means, and a signal cancellation means.

13. Apparatus as defined in claim 6, wherein:
said bounded region comprises a space defined by a structural means.

14. Apparatus as defined in claim 13, wherein:
said structural means comprise building materials that display selected electromagnetic spectrum characteristics.

15. Apparatus as defined in claim 14, wherein:
said shielding means is spatially substantially coextensive with said structural means;
said filtering means is spatially substantially coextensive with said structural means; and
said signal leveling means is spatially substantially coextensive with said structural means.

16. Apparatus as defined in claim 15, wherein:
said shielding means is a band-reject filter.

17. Apparatus as defined in claim 15, wherein:
said filtering means is selected from the group consisting of a band-pass filter, a high-pass filter, and a low-pass filter.

18. Apparatus as defined in claim 15, wherein:
said signal leveling means is selected from the group consisting of a signal absorptive means, a signal reflective means, and a signal cancellation means.

19. Apparatus as defined in claim 15, wherein:
said shielding means comprises said building materials displaying frequency selective electromagnetic characteristics that attenuate said signals within said certain frequency range.

20. Apparatus as defined in claim 15, wherein:
said filtering means comprises said building materials displaying frequency selective electromagnetic characteristics that allow said signals of said second frequency range to pass through said building materials.

21. Apparatus as defined in claim 15, wherein:
said signal leveling means comprises building materials displaying a selected absorptive electromagnetic characteristic to absorb said selected signals within said first frequency range, reflective electromagnetic characteristics to reflect said selected signals within said certain frequency range, or a combination of said characteristics.

22. Apparatus as defined in claim 13, wherein:
said communications system operating within each certain frequency range is a wireless communications system.

23. Apparatus for selective control of propagation of electromagnetic signals including the signals of at least one communications system operating within a certain frequency range through a bounded region, the apparatus comprising:
shielding means for attenuating said electromagnetic signals within said certain frequency range that enter or leave said bounded region; and
filtering means permitting the relatively unattenuated passage across the boundary of signals in at least one second frequency range outside said certain frequency range, said filtering means spatially substantially coextensive with said boundary of said region,
so that users of each communications system within said bounded region can communicate therein without interfering with or interference from another communications system using the same frequency range and located outside said bounded region, and also can communicate through said boundary and outside said bounded region with an exterior communications system operating in said one of said second frequency range.

24. Apparatus as in claim 23, wherein:
said shielding means comprises a band-reject filter spatially substantially coextensive with said boundary of said region.

25. Apparatus as in claim 23, wherein:
said bounded region comprises a space defined by structural means;
said shielding means comprises a band-reject filter spatially substantially coextensive with said structural means; and
said filtering means comprises a filter spatially substantially coextensive with said structural means.

* * * * *